United States Patent [19]

Siegel

[11] Patent Number: 4,608,542
[45] Date of Patent: Aug. 26, 1986

[54] BANDWIDTH CONTROLLED DATA AMPLIFIER

[75] Inventor: Stefan A. Siegel, Mercer County, N.J.

[73] Assignee: RCA Corporation, Princeton, N.J.

[21] Appl. No.: 741,874

[22] Filed: Jun. 6, 1985

[51] Int. Cl.[4] .......................... H03G 3/30; H03F 3/08
[52] U.S. Cl. ................................... 330/279; 330/282; 330/308
[58] Field of Search .................. 250/214 A, 214 AG; 330/59, 279, 281, 282, 308; 455/619

[56] References Cited

U.S. PATENT DOCUMENTS

| | | | |
|---|---|---|---|
| 3,571,721 | 3/1971 | Jabbar | 325/408 |
| 3,999,060 | 12/1976 | Skagerlund | 250/214 |
| 4,415,803 | 11/1983 | Muoi | 250/214 |
| 4,540,952 | 9/1985 | Williams | 330/282 X |
| 4,565,974 | 1/1986 | Smoot | 330/304 |
| 4,567,363 | 1/1986 | Goodnough | 250/214 A |
| 4,567,446 | 1/1986 | Konoshi | 330/308 |

OTHER PUBLICATIONS

Article entitled "PIN-FET Receiver for Fiber Optics", by S. A. Siegel et al., published in RCA Review, Mar. 1984, pp. 4–23, vol. 45.
Article entitled "FETS as Voltage-Controlled Resistors", by James Sherwin, published in SSD/CDE in Aug. 1965, pp. 12–14.

Primary Examiner—Eugene R. LaRoche
Assistant Examiner—Steven J. Mottola
Attorney, Agent, or Firm—Joseph S. Tripoli; Robert L. Troike; William H. Meise

[57] ABSTRACT

A transimpedance amplifier for data signals from a high impedance source includes a forward voltage amplifier and a feedback resistance. The feedback includes an FET. The resistance of the FET is controlled by a control signal derived from the data signal at the output of the transimpedance amplifier by a differentiator which generates pulses for each data transition and an average detector which generates a control signal responsive to the number of transitions per unit time, which is the data rate. The resistance of the FET is high when the data rate is low, reducing the noise magnitude and decreasing the noise bandwidth. When the data rate increases, the resistance of the FET decreases, providing greater bandwidth for handling the signal. The change in gain caused by the bandwidth control tends to change the magnitude of the output data signal. This may be corrected by an AGC loop which controls the open loop gain of the voltage amplifier. In order to reduce the effect of differences in the bit transition time, a limiter may be coupled to the bandwidth control signal generator.

11 Claims, 5 Drawing Figures

BANDWIDTH CONTROLLED DATA AMPLIFIER

BACKGROUND OF INVENTION

This invention relates to data amplifiers having a bandwidth which is adaptively responsive to the data rate of the signal, and more particularly to a transimpedance preamplifier for a photodiode in an optical data communications system.

Optical communications systems are increasingly used for data communications because of their advantages, including low attenuation of the optical signal in a fiber optic cable, and because of the very wide bandwidth achievable, which allows a very high data rate. The optical or light signal propagating along a fiber optic cable may be periodically regenerated by a repeater. When the light signal arrives at the utilization station or at a regeneration station, it is converted into an electrical signal by a photodetector or photodiode. The photodetector generates an electrical signal current in response to the light signal. This current is often very small and may require preamplification before further operations related to regeneration or to generation of data may be performed.

As described in the article "PIN-FET Receiver for Fiber Optics" by Siegel et al., published March 1984 in the RCA Review at pp. 4–23, there are three major approaches to front-end design for an optical receiver. These include termination of the photodetector in a simple low resistance load resistor, termination in a high or integrating impedance, or termination in a transimpedance amplifier (a voltage amplifier having degenerative negative feedback). The simple low resistance input load is advantageous because it provides relatively broad bandwidth, even in the presence of substantial values of input capacitance. However, the low resistance results in large RMS noise currents, which adversely affects performance at low signal levels or in a long optical fiber communications system in which the light signal may be repeatedly converted to an electrical signal at each of a large number of regeneration stations.

It is desirable to keep the input resistance value high to minimize the contribution of thermal noise due to the resistance. The high integrating impedance technique is complex in that the design of the associated equalizer depends upon the signal spectrum and upon the coding format, and there are problems with dynamic range due to the large voltage which can occur.

The transimpedance or negative shunt feedback front end using a high-impedance input stage such as an FET is the most common approach to amplification of signals from photoelectric converters. It has the advantage of high dynamic range and good noise performance. The bandwidth of the photodetector-transimpedance amplifier depends on the total input capacitance at the amplifier input according to the equation $$T(\omega) = \frac{R_F}{1 + jw(C_i R_L/A)}$$

where $R_F$ is the value of the shunt negative feedback resistance, A is the closed loop gain of the voltage amplifier which forms the forward gain path of the transimpedance amplifier, $C_i$ is the total capacitance at the input junction of the photodetector and the transimpedance amplifier, and $R_L$ is the total impedance at the input junction, including the photodiode resistance, the input resistance of the input stage of the voltage amplifier, and the feedback resistor $R_F$. Ordinarily, the photodiode is a high-impedance current source having a high resistance, and the input impedance of the voltage amplifier is also high, so that $R_L = R_F$. Under these conditions, the 3-dB cutoff frequency is $$\omega_{3dB} = A/R_F C_i$$

Circuit optimization consists of minimizing input capacitance $C_i$, and then choosing the largest value of $R_F$ which meets the bandwidth requirements in view of $C_i$. For a given value of $C_i$ established by the parallel capacitances of the photodetector and the input stage of the voltage amplifier, the data rate which must be handled establishes the bandwidth and therefore establishes the maximum allowable value of feedback resistance $R_F$. This, in turn, establishes the noise floor of the receiver. According to the aforementioned article, a buffer stage may be added to the output end of the feedback loop to prevent any parasitic output capacitance from being reflected into the receiver input.

U.S. Pat. No. 4,415,803 issued Nov. 15, 1983, to Muoi describes an optical detector driving a transimpedance amplifier. Enhanced dynamic range is provided by a variable impedance shunt disposed at the amplifier input for shunting signal current to ground. An automatic gain control circuit produces a control signal which varies in response to the amplitude of the output voltage. The control signal is applied to the variable impedance device to vary the impedance thereof. The control voltage is generated by a clamp cascaded with a peak-to-peak detector responsive to the data signal at the output of the amplifier.

SUMMARY OF THE INVENTION

A data amplifier includes a voltage amplifier and a signal feedback arrangement coupled to the amplifier input and output terminals to form a transimpedance amplifier. The resistance of the feedback arrangement is responsive to the data rate of the signal for selecting the bandwidth of the transimpedance amplifier. According to another aspect of the invention, an automatic gain control (AGC) loop is coupled around the amplifier for maintaining constant level of the output signal.

According to yet another aspect of the invention, a transimpedance amplifier with bandwidth responsive to data rate is coupled to a photodiode for amplifying data signals from an optical fiber cable.

DETAILED DESCRIPTION OF THE DRAWING

Figure 1:
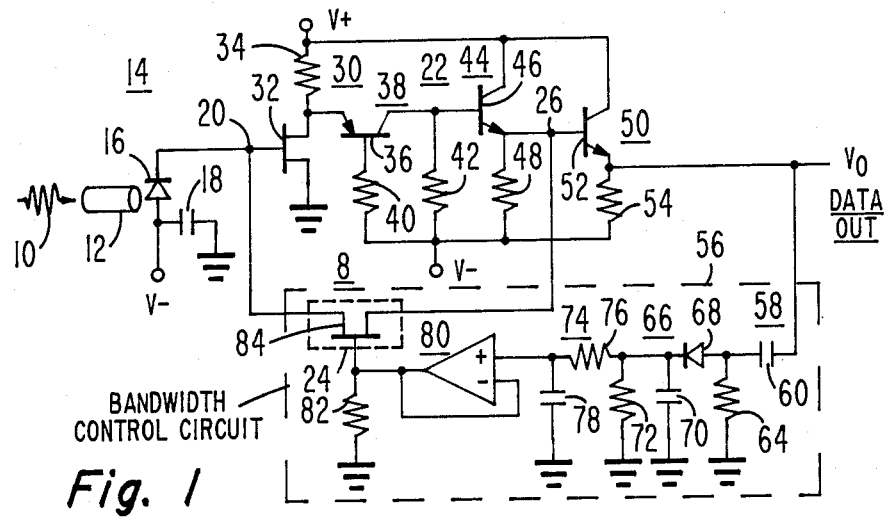
FIGS. 1, 4 and 5 are schematic diagrams of various transimpedance amplifiers arranged for data amplification in accordance with the invention.

In FIG. 1, data modulated light signals illustrated as 10 flowing in a fiber optic cable 12 are received by a receiver designated generally as 14 which includes a photodetector illustrated as a photodiode 16. The cathode of photodiode 16 is coupled to a source V− of operating voltage and is AC coupled to ground by a capacitor 18. The cathode of diode 16 is coupled to an input terminal 20 of a voltage amplifier designated as 22 having a controllable resistance arrangement illustrated as a block 24 coupled between its output terminal 26 and its input terminal 20. Voltage amplifier 22 so connected with a feedback resistance forms a transimpedance amplifier designated 8 which translates signal current from diode 16 to signal voltage at feedback terminal 26.

Voltage amplifier 22 includes a high input impedance inverting amplifier stage designated generally as 30 illustrated as an FET 32 having its source grounded and its drain connected by way of a load resistor 34 to a source V+ of operating potential. Input terminal 20 of amplifier 22 is connected to the gate of FET 32. In order to reduce Miller capacitance effects on the FET in input stage 30, drain signal from FET 32 is applied to the emitter of a PNP bipolar transistor 36 connected as a common base amplifier designated generally as 38. The low input impedance of the emitter of stage 38 reduces the signal-related voltage swing at the drain of FET 32 and reduces Miller feedback. The base of transistor 36 is coupled to a source V— by way of resistor 40. Output signal from common base stage 38 is developed across a resistor 42 coupled between the collector of transistor 36 and V—.

The output signal from common base stage 38 is applied to an emitter follower designated generally as 44 which includes a bipolar NPN transistor 46, the base of which is connected to the collector of transistor 36 and the emitter of which is connected to source V— by a resistor 48. The output signal of amplifier 22 is developed across resistor 48, i.e. between feedback terminal 26 and source V—.

The output signal of voltage amplifier 22 at terminal 26 is coupled to utilization circuits (not illustrated) and to bandwidth control circuit 56 by an emitter follower circuit designated generally as 50 including a bipolar NPN transistor 52 having its base connected to terminal 26, its collector connected to V+ and its emitter connected by way of resistor 54 to V—.

Amplifier stage 30 is inverting, and common base stage 38 and emitter follower 44 are noninverting, so the signal at feedback terminal 26 is inverted by comparison with the input signal applied to input terminal 20 of input amplifier 22. A resistance arrangement 24 is connected between terminal 20 and 26 to provide signal feedback. In accordance with the invention, resistance arrangement 24 is controlled by a bandwidth control circuit designated generally as 56. Control circuit 56 includes a differentiator circuit designated generally as 58. Differentiator 58 includes a differentiating capacitor 60 having one electrode coupled to the emitter of transistor 52 and the other electrode connected to ground by a resistor 64. Differentiated signals developed across resistor 64 are average detected by an average detector designated generally as 66 which includes a rectifier diode 68 and the parallel combination of a smoothing capacitor 70 and a resistor 72. The average detected signal generated across the parallel combination of capacitor 70 and resistor 72 is applied to a smoothing filter designated generally as 74 including a series resistor 76 and filter capacitor 78. A buffer amplifier illustrated as a voltage follower 80 produces a control signal across a resistor 82 which is applied to resistance arrangement 24 for controlling the resistance in the feedback path between the input terminal 20 and output terminal 26 of voltage amplifier 22. As illustrated, resistance arrangement 24 is a field effect transistor (FET) having its source and drain connected in the series feedback path between terminals 20 and 26 and its gate connected to resistor 82 for receiving control signal therefrom.

In operation, optical data pulses generate data currents which are applied by way of terminal 20 to amplifier 22. Since the signal current cannot flow in the high input impedance gate of FET 32, it flows instead through the source-drain of path of FET 84. The gain of the transimpedance amplifier including amplifier 22 and resistance arrangement 24 depends upon the forward gain of amplifier 22 and upon the magnitude of resistance represented by resistance arrangement 24. The figure of merit of a transimpedance amplifier is the output voltage generated in response to an input current, or volts per ampere. Thus, the unit of transimpedance is ohms. When the gain of the forward amplifying path including amplifier 22 is very high or essentially infinite, the transimpedance equals the resistance of resistance arrangement 24. This is readily understood by noting that with an infinite gain, input terminal 20 is a virtual ground and the signal at feedback terminal 26 equals the input current multiplied by the resistance of resistance arrangement 24. This ideal situation is not achieved when very wide bandwidths must be obtained, which at the current state of the art is in the hundreds of megahertz (MHz). At such frequencies, the forward gain of amplifier 22 is limited in the maximum achievable gain per stage and, because of cumulative phase shifts in each stage, the maximum number of stages which is also limited. When the overall forward gain is limited, input terminal 20 is no longer a virtual ground, for finite values of input voltage must appear at terminal 20 relative to ground to drive amplifier 22. The lower the gain of amplifier 22, the greater the drive voltage which must appear at terminal 20 and the less voltage is available at feedback terminal 26.

FIG. 2a illustrates by solid lines 210 a relatively low data rate signal having logic HIGH levels and logic LOW levels, hereinafter referred to simply as HIGHs and LOWs. As illustrated, signal 210 has bit transitions which are very fast by comparison with the duration of a bit. Dotted lines 214 illustrate a condition of lower bit transition speeds (longer bit transition time). FIG. 2b illustrates as solid line pulses 216 the differentiated signals which appear across resistor 64 in response to data signals 212 at the output emitter follower 50. Dotted lines 218 illustrate the relative response of differentiator 58 to relatively slow bit transitions 214. If the bit transitions are slow, the magnitude of the differentiated pulses at each bit transition is smaller than for fast transitions. FIG. 2c illustrates as pulses designated generally as 220 the current flowing in diode 68 of detector 66 in response to pulses 216. The voltage generated across capacitor 70 in response to current pulses 20 is illustrated as 222 of FIG. 2d. The filtered control voltage applied to the gate of FET 84 is illustrated as 224 in FIG. 2e.

Figure 2:
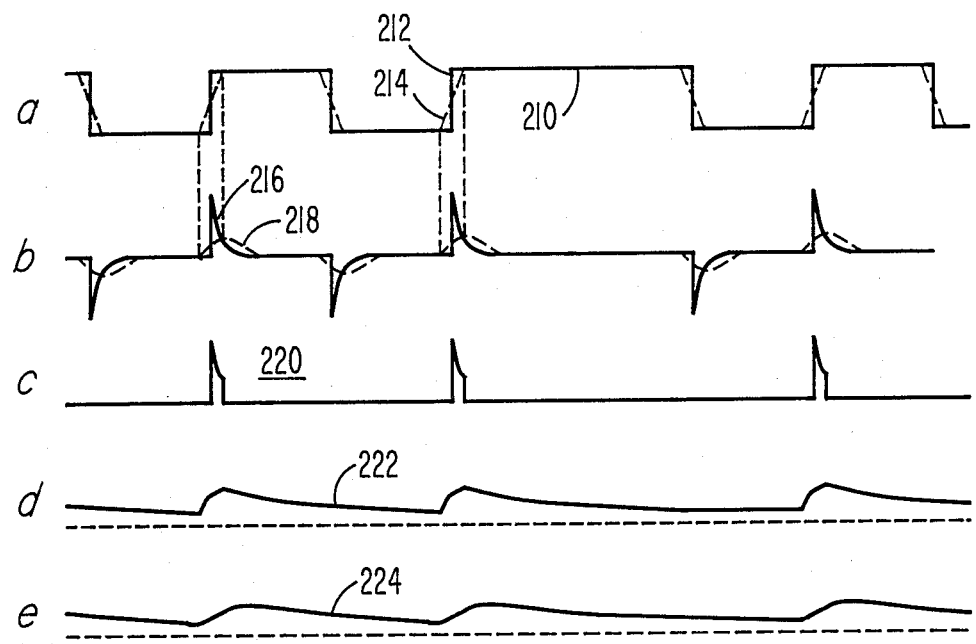
FIGS. 2a–e and 3a–e illustrate waveforms of current or voltage amplitude versus time occurring in the arrangements of FIGS. 1 and 4 during operation.
Figure 3:
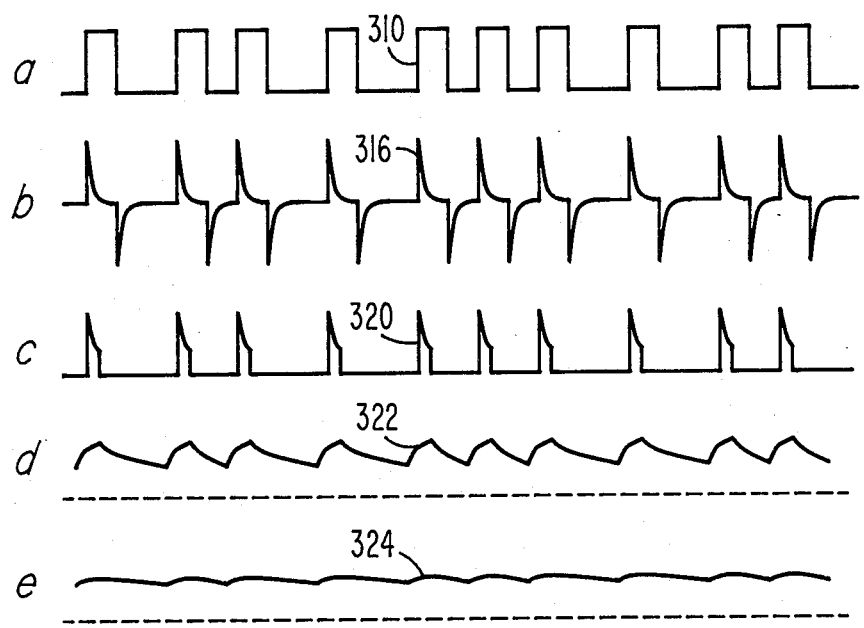

By way of comparison, 310 of FIG. 3 illustrates a data rate which is high by comparison with the data rate of signal of 210. Signal 316 of 3b illustrates the more frequent pulses (more pulses per unit time) occurring across resistor 64 of differentiator 58 in response to pulses 310, and pulses 320 of FIG. 3c illustrate the current pulses applied to capacitor 70 of average detector 66. The detected signal 322 appearing across capacitor 70 in response to current pulses 320 is illustrated in FIG. 3d, and 324 of FIG. 3e illustrate the control voltage applied to the gate of FET 84 for controlling the resistance of FET 84. Control signal 324 is larger than control signal 224 because of the higher data rate of data pulses 320 by comparison with data pulses 210. In the arrangement so far described, a larger control voltage such as 324 representing a higher data rate causes a reduction of resistance in FET 84, thereby increasing the bandwidth and decreasing the gain and input impedance of transimpedance amplifier 21 formed by voltage amplifier 22 and feedback resistance arrangement 24. The increased bandwidth occurs only when the data rate of the data signals being handled requires the increased bandwidth. When the data rate is low, as illustrated in FIG. 2, control signal 224 is relatively small, the resistance of FET 84 is relatively high, the gain of the transimpedance amplifier is relatively high and its noise is low. Thus, the noise performance of transimpedance amplifier 8 is optimized for the particular bandwidth required, so the best possible noise performance is maintained.

Operation of the bandwidth control feedback loop in response to changes in the data rate of the data signal controls the bandwidth by selection of the transimpedance. The bandwidth is established by the intersection of the open-loop transimpedance of amplifier 22 and the closed loop transimpedance. Control of the bandwidth in this manner may have the undesired effect of changing the amplitude of the data signals at feedback terminal 26 and at the emitter of transistor 52 due to changes in the data rate, notwithstanding the input signal amplitude has not changed.

Figure 4:
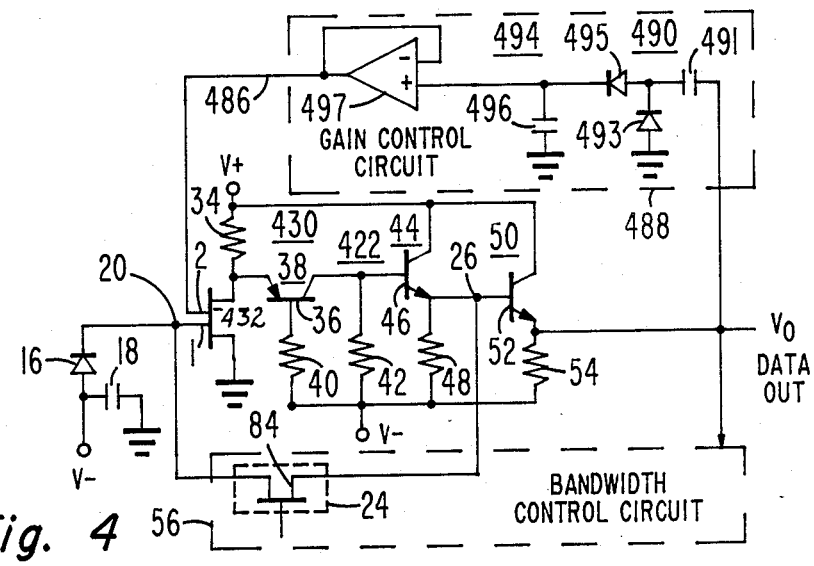

FIG. 4 is a schematic diagram of an arrangement generally similar to that of FIG. 1, but including an automatic gain control (AGC) arrangement or automatic level control (ALC) arrangement for controlling the open loop gain of voltage amplifier 22 to aid in maintaining a constant output level data signal. In FIG. 4, elements corresponding to those of FIG. 1 are designated by the same reference numbers or by the same reference number in the 400 series. In FIG. 4, voltage amplifier 422 differs from amplifier 22 in that input stage 430 is gain controllable, whereas input stage 30 of voltage amplifier 22 has fixed gain. Input stage 430 of amplifier 422 includes a dual gate FET 432 having a first gate terminal 1 to which input terminal 20 is connected for signal amplification as described in conjunction with FIG. 1. FET 432 also includes a gain controlling input gate terminal 2 which is coupled to receive a gain controlling signal over a conductor 486 from a gain control circuit designated generally as 488. Control circuit 488 includes a clamp circuit designated generally as 490 having a clamp capacitor 491 having one electrode connected to the emitter of transistor 52 and the other electrode connected to the cathode of a diode 493. The anode of diode 493 is connected to ground. Data signals having their negative excursion clamped to ground are applied to a peak detector circuit designated generally as 494 which includes a diode 495 having its anode connected to the cathode of diode 493 and its cathode connected to an electrode of capacitor 496, the other electrode of which is connected to ground. The peak-to-peak excursion of the data signal appears as a direct voltage on capacitor 496 and is applied by way of a buffer amplifier 497 to conductor 486 for control of the gain of transistor 432. As known, such as AGC loop tends to maintain constant amplitude of the data signals at the emitter of transistor 52. This tends to compensate for changes in gain occasioned by the operation of the bandwidth control circuit in response to changes in the data rate.

As mentioned in conjunction with FIG. 2, the magnitude of the pulses generated by differentiator 58 may vary in response to the duration of each transition of the data signal, as well as due to differences in the amplitude of the data signal for a constant transition speed. Such changes may undesirably affect the magnitude of the control signal. For example, a decrease in data rate if accompanied by an increase in transition speed may not produce a change in the magnitude of the control signal as large as that of which is desired. Consequently, it may be desirable to reduce the sensitivity of the bandwidth control loop to changes in the magnitude of the data signal or to change in the speed of transition between HIGHS and LOWS.

Figure 5:
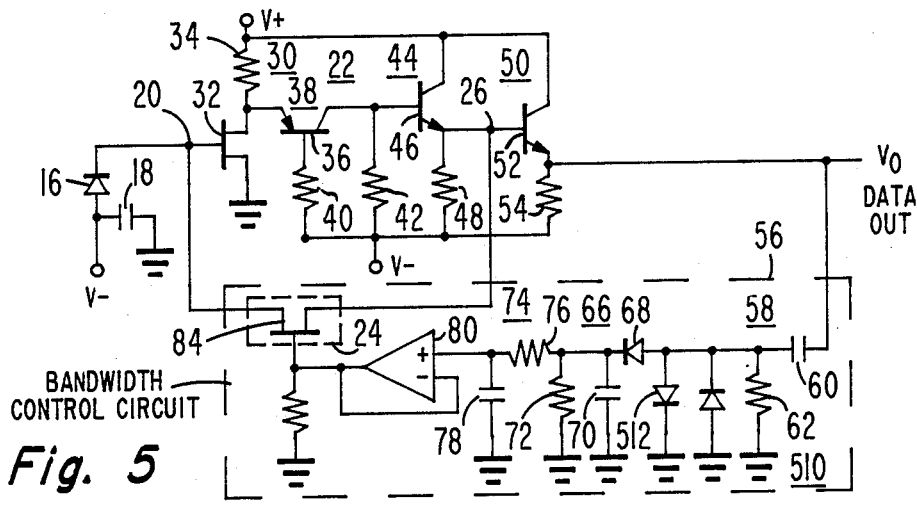

FIG. 5 illustrates an arrangement similar to that of FIG. 1 but including a limiter. FIG. 5 is identical with the arrangement in FIG. 1, except for the addition of an amplitude limiter circuit designated as 510 coupled between differentiator 58 and average detector 66 in bandwidth control circuit 56. Amplitude limiter 510 as illustrated has antiparallel-connected diodes designated together as 512 connected across resistor 62 of differentiator 58. During each positive portion of a differentiated pulse, one of diodes 512 conducts. In order to prevent asymmetry and accumulating a direct offset voltage on capacitor 60, a second, oppositely poled diode is included to similarly limit negative excursions of pulses 216. Thus, all pulses have the same amplitude, so that data rate or the number of pulses per unit time becomes the principal factor affecting the magnitude of the control voltage applied to the gate of FET 84 for control of bandwidth.

Other embodiments of the invention will be apparent to those skilled in the art. For example, amplifier 22 may include more stages than shown or less, and may have multiple inverting stages. Feedback resistance arrangement 24 may include a plurality of variable resistances, and may include fixed resistances in a network with variable resistances to control the resistance extremes.

What is claimed is:

1. An amplifying arrangement for a data signal, comprising:
   a voltage amplifier including signal input and signal output terminals and adapted for amplifying said data signal;
   controllable feedback resistance means coupled between said signal input and signal output terminals of said amplifier to form a transimpedance amplifier;
   differentiating means coupled to receive said data signal for generating a stream of differentiating pulses including a pulse in response to each transition of said data signal; and
   control signal generating means coupled to said differentiating means and to said controllable feedback resistance means for generating a control signal for controlling said resistance means to reduce said resistance in response to increases in the number per unit time of said pulses and to increase said resistance in response to decreases in the number per unit time of said pulses whereby the resistance of said feedback means is responsive to the data rate of said data signal for selecting the bandwidth of said transimpedance amplifier.

2. An arrangement according to claim 1 wherein said control signal generating means comprises:
   rectifying means coupled to said differentiating means for generating undirectional pulses in response to said differentiated pulse; and averaging means coupled to said rectifying means for averaging said undirectional pulses for generating said control signal.

3. An arrangement according to claim 2 wherein said averaging means comprises capacitance means coupled for integrating a current representative of said undirectional pulses.

4. An amplifying arrangement for a data signal, comprising:
a voltage amplifier including signal input and signal output terminals and adapted for amplifying said data signal;
controllable feedback resistance means coupled between said signal input and signal output terminals of said amplifier to form a transimpedance amplifier;
differentiating means coupled to receive said data signal for generating a stream of differentiated pulses including a pulse in response to each transition of said data signal;
rectifying means coupled to said differentiating means for generating undirectional pulses in response to said differentiated pulses; and
control signal generating means coupled to said rectifying means and to said controllable feedback resistance means for generating a control signal for controlling said resistance means to reduce said resistance in response to increases in amplitude and number per unit time of said rectified pulses and to increase said resistance in response to decreases in said amplitude and number per unit time of said rectified pulses whereby said resistance of said feedback resistance means is responsive to the data rate of said data signal for selecting the bandwidth of said transimpedance amplifier.

5. An arrangement according to claim 4 further comprising amplitude limiting means for limiting the amplitude of said differentiated pulses whereby said control signal responds to said number per unit time of said pulses and does not respond to said amplitude of said pulses.

6. An amplifying arrangement for a data signal, comprising:
a gain control voltage amplifier including signal input and signal output terminals and adapted for amplifying said data signal, and also including a gain control input terminal;
feedback means coupled to said signal input and signal output terminals to form a transimpedance amplifier, the resistance of said feedback means being responsive to the data rate of said data signal for selecting the bandwidth of said transimpedance amplifier;
clamping means coupled to said signal output terminal of said voltage amplifier for clamping said data signals to a reference level;
detecting means coupled to said clamping means for generating a peak signal representative of the peak magnitude of said data signals; and
averaging means coupled to said detecting means and to said gain control input terminal of said voltage amplifier for averaging said peak signal for forming a control signal, whereby the amplitude of which is responsive to the amplitude of said data signals at said output terminal of said voltage amplifier whereby a second feedback loop is established for controlling said gain of said voltage amplifier in a manner tending to maintain constant amplitude of said data signals at said output terminal.

7. An arrangement according to claim 6 wherein said voltage amplifier comprises a dual-gate field effect transistor, a first gate of which is coupled to said signal input terminal, and a second gate of which is coupled to said gain control input terminal.

8. An amplifier arrangement adapted for amplifying a bilevel signal from a high impedance source of signal current, comprising:
inverting amplifier means having a relatively high input impedance at an input terminal and a relatively low output impedance at an output terminal for producing an output voltage which equals the input voltage multiplied by a negative constant, said amplifier means having a gain which decreases with increasing frequency;
coupling means coupled to said high impedance source of signal and coupled to said input terminal of said amplifier means for coupling said bilevel signal to said input terminal, said coupling means including an undesired stray capacitance which is effectively coupled across said high impedance of said input terminal and which therefore forms a low pass filter which tends to attenuate high frequency components of said bilevel signal;
differentiating means coupled to said output terminal of said amplifier means for generating ulses during each transition of said bilevel signal, whereby relatively many of said pulses occur per unit time when the data rate of said bilevel signal is large, and relatively few of said pulses occur per unit time when said data rate of said bilevel signal is low, the amplitude of each of said pulses being proportional to the transition speed of said bilevel signal;
averaging means;
rectifying means coupled to said differentiating means and to said averaging means for generating at said averaging means a control signal the magnitude of which depends upon said data rate and said transition speed;
controllable resistance means including a controllable resistance path coupled between said input terminal and said output terminal of said inverting amplifier means, and coupled to said averaging means for receiving said control signal therefrom for decreasing said resistance of said controllable resistance path in response to increases in said amplitude of said control signal, whereby said amplifier means is coupled in a degenerative feedback loop which progressively decreases said gain in response to increases in said amplitude of said control signal whereby the bandwidth of said amplifier means coupled in said feedback loop increases in response to increases in said data rate or in said transition speed or both, and whereby the effective input impedance of said amplifier means coupled in said feedback loop is progressively reduced by increases in said amplitude of said control signal whereby the cutoff frequency of said low pass filter increases thereby reducing said tendency to attenuate high frequency components of said bilevel signal.

9. An arrangement according to claim 8 wherein said inverting amplifier means is a controllable gain amplifier including a gain control input terminal, and further comprising automatic gain control means coupled to said output terminal and to said gain control input terminal for responding to the amplitude of said bilevel signal for controlling the forward gain of said inverting amplifier means for tending to maintain constant amplitude of said bilevel signal.

10. A method for receiving optical data signals comprising the steps of:
applying said optical data signals to a photodiode to produce a data current representative of said data;
applying said data current to a signal input terminal of an inverting voltage amplifier including a feedback resistance to produce an amplified data signal;
producing a transition signal representative of at least some transitions of said data signal;
averaging said transition signal to produce a control signal representative of the data rate; and
controlling said feedback resistance in response to said control signal for varying the bandwidth of said amplifier in response to said data rate; and wherein said step of producing a transition signal includes a differentiating step.

11. A method for receiving optical data signals comprising the steps of:
applying said optical data signals to a photodiode to produce a data current representative of said data;
applying said data current to a signal input terminal of an inverting voltage amplifier including a feedback resistance to produce an amplified data signal;
producing a transition signal representative of at least some transitions of said data signal;
averaging said transition signal to produce a control signal representative of the data rate; and
controlling said feedback resistance in response to said control signal for varying the bandwidth of said amplifier in response to said data rate; and wherein said step of producing a transition signal includes a rectification step.

* * * * *